United States Patent [19]
Mirabel

[11] Patent Number: 5,737,266
[45] Date of Patent: Apr. 7, 1998

[54] METHODS AND APPARATUS FOR PROGRAMMING CONTENT-ADDRESSABLE MEMORIES USING FLOATING-GATE MEMORY CELLS

[75] Inventor: Jean-Michel Mirabel, Cabries, France

[73] Assignee: SGS-Thomson Microelectronics S.A., Saint Genis, France

[21] Appl. No.: 738,231

[22] Filed: Oct. 25, 1996

[30] Foreign Application Priority Data

Oct. 26, 1995 [FR] France .................................. 95 12662

[51] Int. Cl.[6] ........................... G11C 11/34; G11C 15/00
[52] U.S. Cl. ........................... 365/185.22; 365/185.07; 365/201; 365/49
[58] Field of Search ........................... 365/185.22, 49, 365/185.07, 185.09, 201

[56] References Cited

U.S. PATENT DOCUMENTS

| | | | |
|---|---|---|---|
| 4,841,482 | 6/1989 | Kreifels et al. | 365/185.22 |
| 5,051,948 | 9/1991 | Watabe et al. | 365/185.07 |
| 5,111,427 | 5/1992 | Kobayashi et al. | 365/185.07 X |
| 5,136,544 | 8/1992 | Rozman et al. | 365/201 |
| 5,267,213 | 11/1993 | Sung et al. | 365/226 |
| 5,602,777 | 2/1997 | Nawaki et al. | 365/49 |
| 5,644,529 | 7/1997 | Pascucci et al. | 365/185.07 X |

OTHER PUBLICATIONS

French Search Report from French Patent Application No. 95 12662, filed Oct. 26, 1995.

*Primary Examiner*—David C. Nelms
*Assistant Examiner*—Huan Hoang
*Attorney, Agent, or Firm*—Wolf, Greenfield & Sacks, P.C.; James H. Morris

[57] ABSTRACT

A method for the programming of floating-gate memory cells of a content-addressable memory in an integrated circuit comprises the application, through a programming path, of a programming high voltage to the drain of selected cells. The method comprises a verification stage in which the selection of these cells is maintained to obtain direct read access to these cells by applying a read voltage to them through said programming path and to carry out a measurement of current or of voltage on said programming path.

18 Claims, 3 Drawing Sheets

METHODS AND APPARATUS FOR PROGRAMMING CONTENT-ADDRESSABLE MEMORIES USING FLOATING-GATE MEMORY CELLS

BACKGROUND OF THE INVENTION

1. Field of the Invention

The invention relates to methods and apparatus for programming content-addressable memories or CAMs using floating-gate memory cells.

2. Discussion of the Related Art

CAM type memories are used especially (but not exclusively) in redundancy circuits associated with main memories in integrated circuits. Each CAM memory may contain the address of a defective element of main memory. This makes it possible, if necessary, for a redundancy selection circuit to select a redundancy element instead of the defective element when the defective element is addressed. The defective element and, consequently, the redundancy element may be a column of the memory, a row of the memory, a group of columns of the memory, or a group of rows of the memory.

FIG. 1 shows a block diagram of a memory circuit using CAMs to store defective addresses. A main memory MP is addressed through an address bus ADR and an address decoder DEC. CAMs, referenced $CAM_1$ to $CAM_p$, in the example, are thus provided. In the example, the address of a defective memory element is encoded on m bits and each CAM contains m bits plus one validation bit. This validation bit indicates whether or not the address contained in the CAM is defective.

In a CAM of the type with floating-gate memory cells that is being referred to herein, each bit of the CAM is stored in a bistable circuit with two floating-gate memory cells.

In one application to redundancy circuits as described in detail here above, each CAM used therefore has m+1 bistable circuits of this type to store a defective address on m bits and to indicate, by the state of one validation bit, whether the CAM in question is used (namely whether it actually stores a defective address) or not. The m bits of a memory $CAM_1$ that store an address are referenced $D_i(0)$ to $D_i(m-1)$ and the validation bit is referenced $val_i$, with $i \& [1,p]$. The bits of the different CAMs are applied to a respective comparison circuit $COMP_1$ to $COMP_p$.

Each comparison circuit $COMP_i$ compares each of the bits $D_i(0)$ to $D_i(m-1)$ of the memory $CAM_i$ with address bits present at the address bus ADR, in the example $a_0$ to $am1$. This comparison is obtained, for example, for each bit by a single EXNOR type logic gate which gives one at output if the two bits compared are identical, equal to 0 or 1, and gives zero at output if the two bits compared are complementary. The comparison circuit will then include a NAND gate to deliver zero at output, if the output of each of the EXNOR gates is at one and if the validation bit of the corresponding memory CAMi is at one. Otherwise, this NAND gate will deliver a one at output. The p outputs $R_1$ to $R_p$ of the p comparison circuits $COMP_i$ associated with the p memories $CAM_i$ are applied to a circuit for the selection of the redundancy elements SEL_R. This selection circuit sends an inhibition signal inh to the decoder of the main memory MP if one of the signals $R_1$ to $R_p$ is at zero, for the selection of an element of the redundancy memory MR, rather than an element of the main memory.

At the end of manufacture, the two cells of each of the bistable circuits of the CAMs are blank. When the integrated circuit is put under voltage, the CAMs are immediately powered and the memory cells of the bistable circuits are polarized. Since the two cells of each of the bistable circuits are blank, the bistable circuits are then in current consumption mode.

The standards for consumption by an integrated circuit in idle mode are stringent and allow only a very low level of consumption current. It is therefore necessary to prevent this kind of consumption by the bistable circuits in the integrated circuit. It is enough to program one of the two cells in order that the bistable circuit may be in a mode where it does not consume current. Depending on the cell that is programmed, the output of the bistable circuit changes or does not change its state. Indeed, at the outset, the two cells are blank. This leads to a binary zero state at output of each bistable circuit.

Depending on whether one or the other of the cells of a bistable circuit is programmed, a zero binary state or a one binary state is obtained at output. Hence, depending on the cell that is programmed in the bistable circuit, the binary state read at output changes or does not change with respect to the original state in which the two cells were blank. In practice therefore, all the bistable circuits of the CAMs used in an integrated circuit are programmed, whether these memories are really used or not.

When the cells are floating-gate memory cells in an application, it is necessary to carry out tests to ascertain that they are properly programmed. If necessary, the application of the programming signal may be repeated until an accurate programming test result is obtained, or a cell that cannot be programmed may be labeled as being defective. This proves to be all the more necessary as it has been seen that a non-programmed or badly programmed bistable circuit may give rise to an unwelcome level of current consumption.

In redundancy applications as specified further above with reference to FIG. 1, it is common to test the signals $R_i$ applied to the redundancy selection circuit. Now, all that is tested in this way are the CAMs actually used. It is possible to conceive of carrying out tests, further upline, on the outputs of the CAMs. Apart from the fact that the testing circuitry would take up too much space (with p*[m+1] wires to be tested), the output of a bistable circuit changes only if a specified cell of this bistable circuit is programmed. Hence, if it is another cell that is programmed, the output does not change. This means that it is possible to test only the programming of the cell causing a change in this state of the output of the bistable circuit. All this proves to be very inadequate in practice. Indeed, the bad programming of a cell of a CAM may prompt current leakages which may make a tester decide to discard the circuit, for example if the current consumption proves to be above the levels stipulated by the standards. The integrated circuit could again be discarded because the activation of the redundancy does not work properly (with a defective wrongly programmed address).

An object of the invention is a method for the improved programming of a CAM.

An object of the invention is a method for the programming of a CAM that enables reliable testing of the programming.

SUMMARY OF THE INVENTION

As claimed, the invention relates to a method for programming of floating-gate memory cells of a content-addressable memory in an integrated circuit.

The programming method includes the application, by means of a switching circuit and through a programming path, of a high voltage programming pulse to the drain of selected cells. According to the invention, in a verification stage, the selection of these cells is maintained to obtain direct access to these cells by applying a read voltage to them through programming path and to carry out a measurement of current or of voltage on path.

BRIEF DESCRIPTION OF THE DRAWINGS

Other advantages and characteristics are specified in the following description, given by way of an indication that in no way limits the scope of the invention, and with reference to the appended drawings, of which.

DETAILED DESCRIPTION

Figure 2:
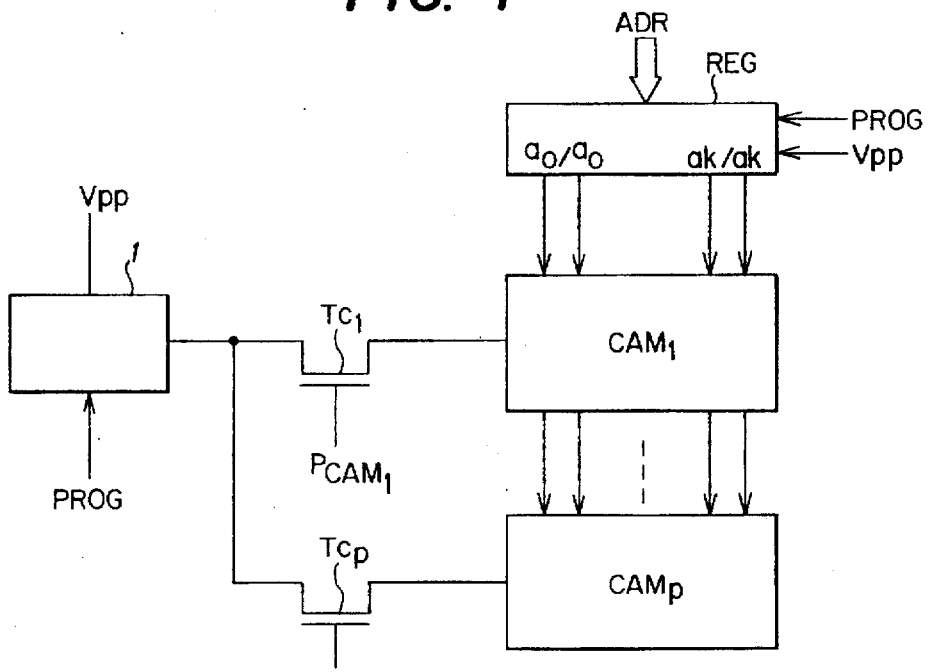
FIG. 2 is a general drawing of means for programming CAMs of an integrated circuit.

FIG. 2 shows a general view of the principle of the programming of memories $CAM_0, \ldots, CAM_p$ in an integrated circuit. To each memory $CAM_i$, there corresponds a switching transistor $Tc_i$ that enables the selection of the memory to be programmed and applies a high voltage programming pulse to it, this pulse being delivered by a high voltage switching circuit 1. The high voltage switching circuit 1 is activated by a command signal referenced PROG. The switching transistor $Tc_i$ associated with the memory $CAM_i$ is activated by a command signal $PCAM_i$. Finally, the word to be programmed in a selected memory is applied through a register REG by means of the address bus. The signals PROG, $PCAM_i$ and the word to be programmed may be managed by a tester of the integrated circuit. Alternatively, the signals may be, all or in part, managed internally by an appropriate control unit of the integrated circuit.

Figure 3:
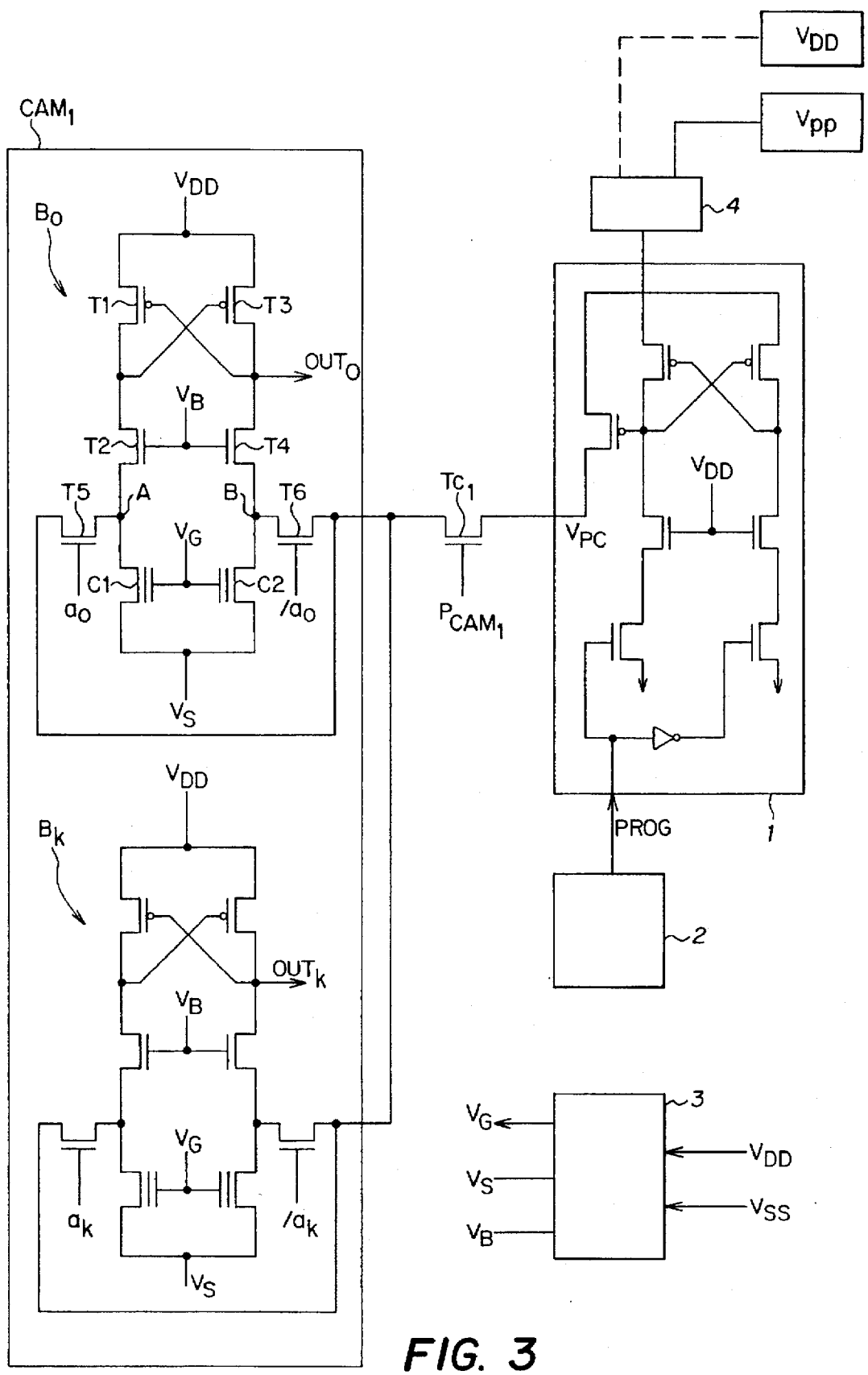
FIG. 3 shows a detailed drawing of a circuit for programming a CAM according to an embodiment of the invention.

In FIG. 3, a memory $CAM_1$ and the programming means of this memory are shown in detail. The memory $CAM_1$, in this example, has k+1 storage bistable circuits. Two of these bistable circuits are shown: $B_0$ and $B_k$.

A bistable circuit with floating-gate memory cells conventionally includes two memory cells and six transistors to program and read the bistable circuit.

Thus, the bistable circuit $B_0$ has a first cell C1 connected between ground and a node A and a second cell C2 connected between ground and a node B. The gates of the two cells are connected together. A gate voltage VG is applied to them by a voltage generation circuit 3, the level of which depends on the operation performed: reading, programming or even erasure. When the voltage is mined on, it is the read level that is applied to the gate of the memory cells. The read level is, for example, between zero and the logic supply voltage VDD. Between the logic supply voltage VDD of the circuit and node A, a first transistor T1 and a second transistor T2 are connected in series. In the example, T1 is a MOS transistor with P type conductivity, the source of which is connected to the voltage VDD. The transistor T2 is a MOS transistor with N type conductivity, the source of which is connected to node A.

Similarly, between the logic supply voltage VDD of the circuit and node B, a third transistor T3 and a fourth transistor T4 are connected in series. In the example, the transistor T3 is a MOS transistor with P type conductivity whose source is connected to the voltage VDD. The transistor T4 is a MOS transistor with N type conductivity whose source is connected to node B.

The second and fourth transistors T2 and T4 have their gates connected together. A voltage VB is applied to them by the voltage generation circuit 3.

Figure 1:
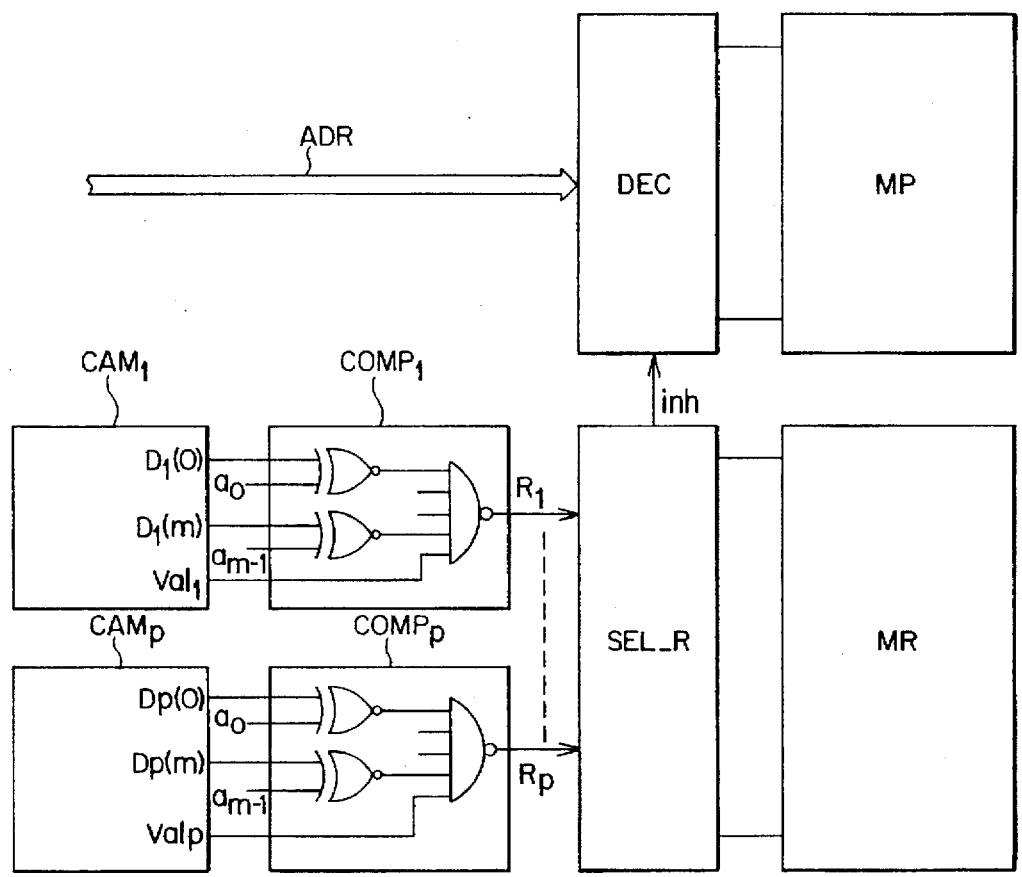
FIG. 1 shows a block diagram of a memory circuit using CAMs.

The gate of the transistor T1 is connected to the drain of the transistor T3. The gate of the transistor T3 is connected to the drain of the transistor T1. Either drain of the transistors T1 and T3 is used as an output $OUT_0$ of the bistable circuit. In the example, the drain of the transistor T3 is chosen. Thus, if the cell C1 is not programmed, it is on and it draws the drain of the transistor T1 towards zero volts. There is therefore zero volts at the gate of the transistor T3. This transistor T3 therefore takes its drain towards the supply voltage VDD. The output $OUT_0$ of the bistable circuit $B_0$, which originally had two blank cells, therefore changes its state and goes from zero to one. If it is the other cell C2 that is not programmed, the output of the bistable circuit does not change its state and remains at zero. This is well known. (It will be noted that the output referenced $OUT_0$ corresponds to the output referenced $D_1(0)$ in FIG. 1.)

To select and program either of the cells, a fifth transistor and a sixth transistor are provided in each bistable circuit. Thus, in the bistable circuit $B_0$, a fifth transistor T5 is provided in series between a switching transistor $Tc_1$ associated with the memory $CAM_1$ and the drain of the cell C1. The fifthe transistor T5 is controlled at its gate by a corresponding address high voltage signal $a_0$ derived from the address bus. The sixth transistor T6 is provided in series between the switching transistor $Tc_1$ associated with the memory $CAM_1$ and the drain of the cell C2. The sixth transistor T6 is controlled at its gate by the corresponding inverted high voltage address signal/$a_0$ derived from the address bus. It has been seen that the high voltage VPC needed for programming the memory $CAM_1$ is applied by the switching transistor referenced $Tc_1$. This transistor switches over the programming high voltage pulse VPC given by the high voltage change-over switch 1. This voltage pulse is itself switched over by one of the two transistors T5 or T6 to the drain of the associated cell C1 or C2, depending on the respective state of the high voltage address signals derived $a_0$ and/$a_0$ (in order that the transistors T5 and T6 may switch over high voltage, they need to be controlled in high voltage, namely with an active level at their gate equal to the voltage level to be switched over).

In FIG. 3, a well-known example of a structure of a high voltage switching circuit 1 is shown. This structure is described in French patent application No. 2 693 327 by the present Applicant which is hereby incorporated by reference.

This high voltage switching circuit is connected between a high voltage VPP and ground. The high voltage VPP, in this example, is applied by an external source to a supply pin 4 of the integrated circuit. The switching circuit 1 delivers a voltage pulse VPC at output, the high level of this voltage pulse VPC being that of the external high voltage VPP, or it delivers a zero level at output, according to the pulse command PROG applied to the switching circuit. In the example shown, the command PROG is generated by a control unit 2.

This control unit may be a microprocessor or a sequencing circuit of the integrated circuit. The duration of the pulse is calibrated as a function of the operation to be performed and the nature of the memory cells (EPROM, EEPROM). The duration of the programming pulse of the memory cells $CAM_1$ is referenced d1.

The means for programming the bistable circuits of the memory $CAM_1$ therefore include chiefly means for switching over the programming pulse to the cells namely, in the example: the switching circuit 1 and the transistor Tc1.

It has been seen that the selection of the cells to be programmed is done by the signals of the address bus. In other words, it is done by the high voltage signals $a_i$ derived from the address bus and their reverse signals/$a_i$, applied respectively to the transistors T5 and T6 of the bistable circuit $B_i$.

Thus, the method of programming of a CAM memory includes the application of the address word to be programmed to the address bus, the application of a switching command PROG with a duration d1 and the turning on of the switching transistor $Tc_1$ associated with the memory, for the application to the drain of the selected cell of a high voltage programming pulse with a duration d1.

At the end of the pulse, one cell is programmed in each bistable circuit.

Thus, normally, there should no longer be any bistable circuit consuming current.

According to an embodiment of the invention, it is then planned to measure the current on the programming path, namely on the line of application of the programming high voltage applied to the drain of the program cell, by directly accessing the cells in read mode.

Maintaining the addressed word to be programmed on the transistors T5 and T6 of the bistable circuits (output of the register REG of FIG. 2) includes maintaining the selection of the cell to whose drain the programming pulse has been applied. This enables the application, to this drain, of a read voltage, for example VDD. This read voltage may be given by an external supply source to the supply pin which normally receives VPP. This may be done by a tester.

If the selected cell has been properly programmed, the selected cell does not let through any current. If on the contrary the selected cell has not been well programmed, the selected cell draws current on the application path of the pulse, i.e. especially on the pin 4. This current may then be measured on this external pin 4. It is then possible to decide on a new application of the programming pulse and then redo the test, until no longer any current is measured, or until it is decided that the cell is defective. If it is decided that the cell is defective, the defective CAM may be cut off from the rest of the circuit so that it no longer consumes any current.

In the example, the tester supervises the operation of programming with verification by direct access in read mode and measurement of the current. In an application of redundancy in a memory circuit, this operation will be performed by the tester in the phase for the repairing of the main memory.

In the above explanation, it can be seen that the test is carried out comprehensively on all the cells that have been programmed in a CAM. However, it is quite possible to provide for more complex circuitry to access the programmed cells individually. However, this would make the programming procedure far lengthier without improving the reliability of the programming of the cells.

Figure 4:
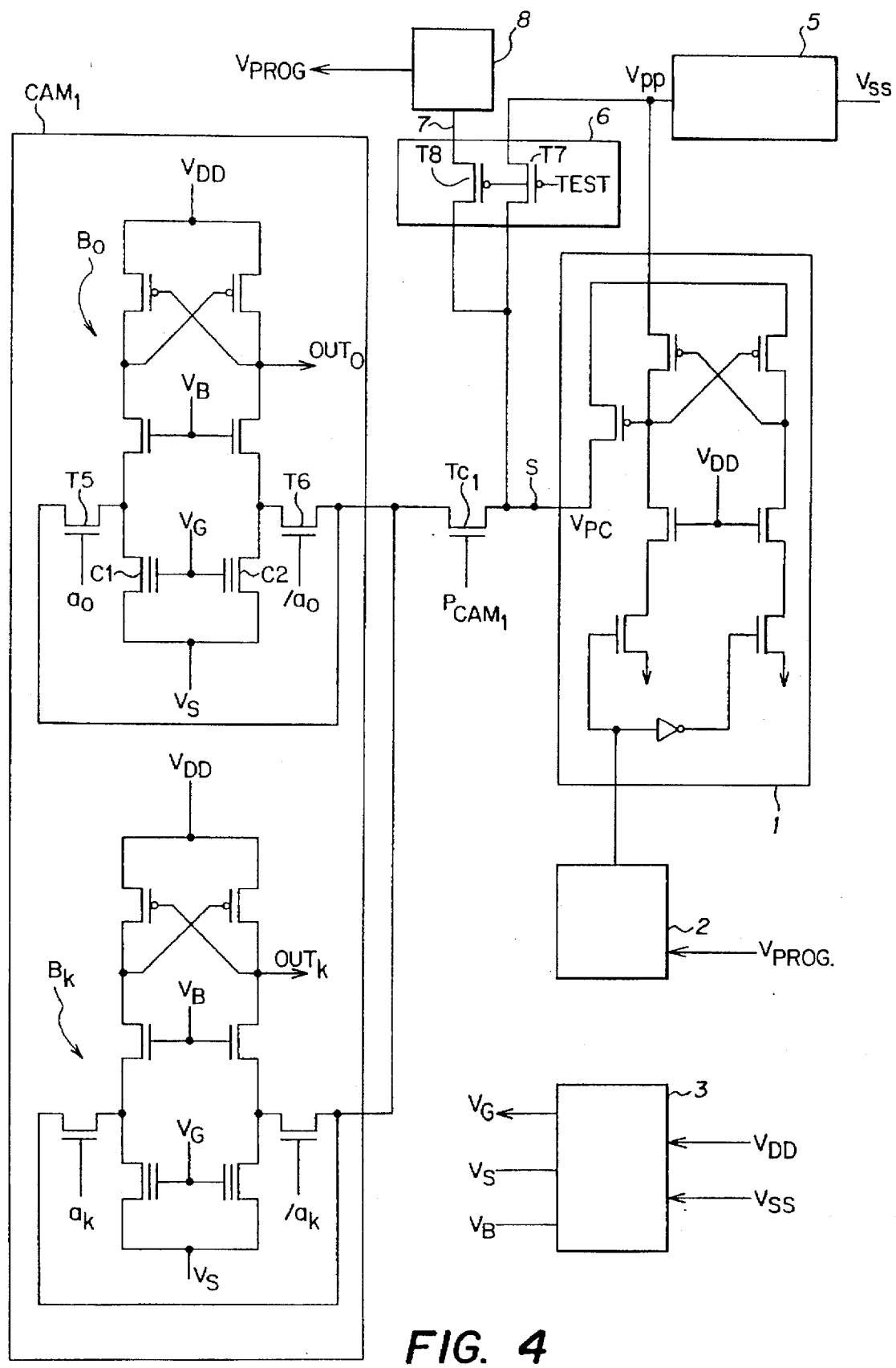
FIG. 4 is a detailed drawing of a circuit for programming a CAM according to another embodiment of the invention.

FIG. 4 shows an alternative embodiment of the invention. It can be applied especially to an integrated circuit that includes a voltage multiplier 5 to generate the high voltage VPP internally out of the logic supply voltage VDD of the circuit. In this case, the high voltage switching circuit 1 has a complementary circuit 6 to set the voltage at output of the switching circuit 1 when at least one of the selected cells of the selected CAM lets through current.

In the example, this complementary circuit 6 has two transistors T7 and T8. The transistor T7 is mounted between the voltage VPP and the voltage VPC at output of the switching circuit 1. It is controlled in the on state by a testing signal (referenced TEST). This transistor is resistive, to draw the level of the voltage VPC towards zero volt if at least one of the selected cells consumes current. If no current flows on the line VPC, the level of VPC remains at VPP throughout the time of the test. The test may use the same command PROG of the switching circuit for the application, as the test pulse, of the programming pulse with a duration d1. The other transistor T8 is connected between the output of the switching circuit and a testing point 7. Transistor T8 is controlled in the ON state by the signal TEST. Transistor T8 enables the transmission, to the testing point 7, of the level of the voltage VPC. This voltage level may then be measured or compared with a reference. In practice, if this level is zero, it means that current is flowing on the line. From this, it can be deduced that at least one cell has not been accurately programmed.

The checking of the programming of the CAM according to this variant can be done internally, under the control of the control unit 2 or an appropriate automaton. It is then the control unit that generates the TEST signal. A comparison circuit 8 compares the voltage level at point 7 with a reference, and delivers a checking signal to the control unit 2. The control unit decides whether or not a programming pulse should be applied to the CAM to be programmed. This internal embodiment of the programming method is useful especially for applications of dynamic redundancy.

This embodiment may be controlled by the tester equally well. In this case, the voltage at the point 7 is brought out on one of the external pins of the integrated circuit.

The programming method according to an embodiment of the invention includes, after the application of the programming word to the signals of the address bus of the integrated circuit in order to select the cells to be programmed, the selection of the CAM to be programmed ($Tc_j$), and then the application a first high voltage programming pulse (VPC), while the selection of these cells is maintained in order to access them directly in read mode and carry out a measurement of current or voltage on the path of application of the high voltage programming pulse.

The invention has been explained in part with reference to the memory circuits using CAMs for redundancy, but it can be applied more generally to all integrated circuits using CAMs.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for programming floating-gate memory cells of a content-addressable memory in an integrated circuit, the method comprising the steps of:

selecting the floating-gate memory cells of the content-addressable memory in the integrated circuit;

applying, through a programming path, a programming high voltage to drains of the selected floating-gate memory cells;

applying, in a verification stage, a read voltage to the selected floating-gate memory cells through the programming path, such that selection of the floating-gate memory cells is maintained to obtain direct read access of the selected floating-gate memory cells; and measuring, in the verification stage, one of current and voltage on the programming path.

2. The method of claim 1, wherein the step of applying the programming high voltage includes a step of receiving, by a switching circuit, the programming high voltage from an external pin of the integrated circuit; wherein the step of applying the read voltage includes a step of applying, in a programming phase, the read voltage to the external pin; and wherein the step of measuring includes a step of measuring current on the external pin.

3. The method of claim 1, wherein the step of measuring includes the steps of:

activating, in a verification phase, a circuit that sets a level of a programming pulse delivered at an output of a switching circuit to zero when current is present on the programming path; and measuring the level of the programming pulse at the output of the switching circuit.

4. A method for programming a content-addressable memory, the method comprising the steps of:

selecting a cell of the content-addressable memory;

applying a programming voltage to the selected cell, through a programming path, to program the selected cell;

applying, after the step of applying the programming voltage, a read voltage to a drain of the selected cell through the programming path; and measuring, while the read voltage is applied to the drain of the selected cell, one of voltage and current through the programming path to determine whether the selected cell consumes current.

5. The method of claim 4, wherein the step of measuring includes the steps of:

connecting the programming path to a source that provides the programming voltage; and measuring a resulting voltage at a test point; wherein the resulting voltage is based on the programming path and the source being electrically connected.

6. The method of claim 5, wherein the step of connecting includes a step of activating, in response to a testing signal, a first transistor coupled between the programming path and the source; and wherein the step of measuring the resulting voltage includes the steps of activating, in response to the testing signal, a second transistor coupled between the programming path and the test point and comparing the resulting voltage to a reference voltage.

7. The method of claim 4, further comprising a step of:

repeating the steps of applying the programming voltage, applying the read voltage and measuring the one of voltage and current, after the step of measuring the one of voltage and current indicates current consumption by the selected cell through the programming path.

8. The method of claim 7, further comprising a step of:

signaling that the selected cell is defective after performing the step of repeating a predetermined number of times.

9. A programming circuit for programming a content-addressable memory in an integrated circuit, the programming circuit comprising:

a switching circuit having an input that receives a first signal, and an output that provides one of a programming voltage and a read voltage in response to the first signal;

a switching transistor coupled between the switching circuit and a cell of the content-addressable memory, the switching transistor having a control terminal that receives a second signal;

a control circuit that provides the first signal to the input of the switching circuit and the second signal to the control terminal of the switching transistor, to apply the programming voltage and the read voltage to the cell; and means for measuring, when the read voltage is applied to a drain of the cell, one of voltage and current through the switching transistor to determine whether the cell consumes current.

10. The programming circuit of claim 9, wherein the means for measuring includes:

means for connecting the switching transistor to a source that provides the programming voltage; and means for measuring a resulting voltage at a test point, wherein the resulting voltage is based on the switching transistor and the source being electrically connected.

11. The programming circuit of claim 10, wherein the means for connecting includes a second transistor coupled between the switching transistor and the source, the second transistor having a control terminal that receives a testing signal; and wherein the means for measuring the resulting voltage includes a third transistor coupled between the switching transistor and the test point, the third transistor having a control terminal that receives the testing signal, and means for comparing the resulting voltage to a reference voltage.

12. The programming circuit of claim 9, wherein the control circuit is adapted to reapply the programming voltage and the read voltage to the cell after the means for measuring the one of voltage and current indicates current consumption by the cell through the switching transistor.

13. The programming circuit of claim 12, further comprising:

means for signaling that the cell is defective after the programming voltage and the read voltage have been reapplied a predetermined number of times.

14. A programming circuit for programming a content-addressable memory in an integrated circuit, the programming circuit comprising:

a switching circuit having an input that receives a first signal, and an output that provides a programming voltage and a read voltage in response to the first signal;

a switching transistor coupled between the switching circuit and a cell of the content-addressable memory, the switching transistor having a control terminal that receives a second signal;

a control circuit that provides the first signal to the input of the switching circuit and the second signal to the control terminal of the switching transistor, to apply the programming voltage and the read voltage to the cell; and a testing circuit that measures, when the read voltage is applied to a drain of the cell, one of voltage and current through the switching transistor to determine whether the cell consumes current.

15. The programming circuit of claim 14, wherein the testing circuit includes:

a connecting circuit that connects the switching transistor to a source that provides the programming voltage; and a measuring circuit that measures a resulting voltage at a test point, wherein the resulting voltage is based on the switching transistor and the source being electrically connected.

16. The programming circuit of claim 15, wherein the connecting circuit includes a second transistor coupled between the switching transistor and the source, the second transistor having a control terminal that receives a testing signal; and wherein the measuring circuit includes a third transistor coupled between the switching transistor and the test point, the third transistor having a control terminal that receives the testing signal, and a comparing circuit that compares the resulting voltage to a reference voltage.

17. The programming circuit of claim 14, wherein the control circuit is adapted to reapply the programming voltage and the read voltage to the cell after the measuring circuit indicates current consumption by the cell through the switching transistor.

18. The programming circuit of claim 17, further comprising:

a signaling circuit that signals that the cell is defective after the programming voltage and the read voltage have been reapplied a predetermined number of times.

* * * * *